(12) United States Patent
Nishimura et al.

(10) Patent No.: US 10,283,271 B2
(45) Date of Patent: May 7, 2019

(54) LAMINATED ELECTRONIC COMPONENT AND LAMINATED ELECTRONIC COMPONENT MOUNTING STRUCTURE

(71) Applicant: KYOCERA Corporation, Kyoto-shi, Kyoto (JP)

(72) Inventors: Michiaki Nishimura, Higashine (JP); Yasuhisa Shigenaga, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/110,508

(22) PCT Filed: Jan. 16, 2015

(86) PCT No.: PCT/JP2015/051097
§ 371 (c)(1),
(2) Date: Jul. 8, 2016

(87) PCT Pub. No.: WO2015/108151
PCT Pub. Date: Jul. 23, 2015

(65) Prior Publication Data
US 2016/0336114 A1    Nov. 17, 2016

(30) Foreign Application Priority Data
Jan. 17, 2014  (JP) ................ 2014-006849

(51) Int. Cl.
*H01G 4/30*        (2006.01)
*H01G 2/06*        (2006.01)
(Continued)

(52) U.S. Cl.
CPC ............. *H01G 4/30* (2013.01); *H01G 2/06* (2013.01); *H01G 4/12* (2013.01); *H01G 4/232* (2013.01);
(Continued)

(58) Field of Classification Search
CPC .................................................. H01G 4/30
(Continued)

(56) References Cited

U.S. PATENT DOCUMENTS

2002/0021547 A1* 2/2002 Sakai ............... H01G 9/15
                                                361/532
2004/0174656 A1* 9/2004 MacNeal .......... H01G 4/30
                                                361/306.3

(Continued)

FOREIGN PATENT DOCUMENTS

JP    05-299286 A    11/1993
JP    63-071524 U    5/1998

(Continued)

OTHER PUBLICATIONS

International Search Report, PCT/JP2015/051097, dated Apr. 7, 2015, 2 pgs.

(Continued)

*Primary Examiner* — Stanley Tso
(74) *Attorney, Agent, or Firm* — Volpe and Koenig, P.C.

(57) ABSTRACT

A laminated electronic component includes a main body including an effective layer in which dielectric layers and internal electrode layers are alternately laminated, and a pair of a first cover layer and a second cover layer which are disposed on opposite sides, respectively, in a stacking direction of the effective layer; and a plurality of external electrodes disposed on an outer surface of the main body. The internal electrode layers are alternately connected to the different external electrodes, and the first cover layer has a high-Young's modulus layer which is higher in Young's modulus than the dielectric layers. By mounting such a laminated electronic component to a substrate so that the (Continued)

first cover layer and a mounting face of the substrate are opposed to each other, it is possible to suppress acoustic noise.

12 Claims, 15 Drawing Sheets

(51) Int. Cl.
   *H01G 4/12*      (2006.01)
   *H01G 4/232*     (2006.01)
   *H05K 1/18*      (2006.01)
   *H05K 1/02*      (2006.01)

(52) U.S. Cl.
   CPC .......... *H05K 1/181* (2013.01); *H05K 1/0271* (2013.01); *H05K 2201/10015* (2013.01); *H05K 2201/10636* (2013.01); *Y02P 70/611* (2015.11)

(58) Field of Classification Search
   USPC .......................................................... 174/260
   See application file for complete search history.

(56)                References Cited

U.S. PATENT DOCUMENTS

| 2007/0164639 A1* | 7/2007 | Ohmori | H01L 41/293 |
| | | | 310/366 |
| 2007/0223206 A1 | 9/2007 | Ogawa | |
| 2008/0297976 A1 | 12/2008 | Togashi et al. | |
| 2013/0056252 A1 | 3/2013 | Fujii et al. | |
| 2013/0233606 A1 | 9/2013 | Fujii et al. | |
| 2013/0319741 A1* | 12/2013 | Ahn | H01G 4/30 |
| | | | 174/260 |
| 2014/0008116 A1 | 1/2014 | Fujii et al. | |
| 2015/0016015 A1* | 1/2015 | Lee | H01G 4/30 |
| | | | 361/301.4 |
| 2015/0041193 A1* | 2/2015 | Lee | H01G 4/12 |
| | | | 174/258 |

FOREIGN PATENT DOCUMENTS

| JP | 2001-326445 A | 11/2001 |
| JP | 2007-103496 A | 4/2007 |
| JP | 2008-300566 A | 12/2008 |
| JP | 2012-094785 A | 5/2012 |
| JP | 2013-065820 A | 4/2013 |
| JP | 2014-203994 A | 10/2014 |
| WO | 2006/104032 A1 | 10/2006 |

OTHER PUBLICATIONS

Japanese Office Action with English concise explanation, Japanese Patent Application No. 2015-557891, dated Jun. 27, 2017, 13 pgs.

* cited by examiner (a)

(b)

(a)

(b)

LAMINATED ELECTRONIC COMPONENT AND LAMINATED ELECTRONIC COMPONENT MOUNTING STRUCTURE

TECHNICAL FIELD

The present invention relates to a laminated electronic component and a laminated electronic component mounting structure.

BACKGROUND ART

In an electronic component of laminated type composed of a stack of dielectric layers and internal electrode layers, when DC voltage and AC voltage are simultaneously applied to the electronic component, strain occurs in the dielectric layer due to the electrostrictive effect of a dielectric, causing vibration in the electronic component in itself. In response to the vibration of the electronic component, a substrate with the electronic component mounted thereon by solder or the like is vibrated, and, when resonance occurs in the substrate at a resonance frequency in an audio frequency range, vibration sound is generated. This phenomenon is known as "acoustic noise".

Various proposals to suppress such a "acoustic noise" have been made to date, for example, a method for reducing vibration by relieving strain in an electronic component in itself (with use of, for example, a low-permittivity material which produces low electrostrictive effect, or an internal electrode pattern designed to reduce electrostrictive effect), and a method for restraining vibration of an electronic component from being transmitted to a substrate by absorbing the vibration (by, for example, a metallic terminal or lead, or by setting the height of a solder fillet properly). For example, Patent Literature 1 discloses a mounting structure in which an electrically-conductive material serving as a medium for propagation of capacitor vibration is spaced away from a part of a capacitor which undergoes greatest vibration. In this structure, vibration is hardly transmitted to a circuit board.

CITATION LIST

Patent Literature

Patent Literature 1: Japanese Unexamined Patent Publication JP-A 2013-065820

SUMMARY OF INVENTION

Technical Problem

However, even in the case of absorbing vibration by a metallic terminal or lead, or in the mounting structure as disclosed in Patent Literature 1, it is impossible to obtain vibration attenuation effect appropriately for complicated manufacturing process and mounting process.

The invention has been devised in view of the problems as discussed supra, and an object of the invention is to provide a laminated electronic component which is capable of suppressing acoustic noise when mounted on a substrate, and a laminated electronic component mounting structure.

Solution to Problem

A laminated electronic component according to one embodiment of the invention comprises: a main body comprising an effective layer in which dielectric layers and internal electrode layers are alternately laminated, and a pair of a first cover layer and a second cover layer which are disposed on opposite sides in a stacking direction of the effective layer, respectively; and a plurality of external electrodes disposed on an outer surface of the main body, the internal electrode layers being alternately connected to different external electrodes, the first cover layer comprising a high-Young's modulus layer which is higher in Young's modulus than the dielectric layers.

A laminated electronic component mounting structure according to another embodiment of the invention comprises: a substrate having a mounting face; and the above-described laminated electronic component joined to the mounting face of the substrate, the first cover layer of the laminated electronic component being opposed to the mounting face.

Advantageous Effects of Invention

According to the invention, it is possible to provide a laminated electronic component which is capable of suppressing acoustic noise when mounted on a substrate, and a laminated electronic component mounting structure.

BRIEF DESCRIPTION OF DRAWINGS

FIG. 1(a) is a perspective view of the laminated electronic component, FIG. 1(b) is a plan view thereof as seen from a first face, and FIG. 1(c) is a sectional view thereof taken along the line A1-A1 shown in FIG. 1(a);

FIG. 3(a) is an exploded perspective view of the laminated electronic component, FIG. 3(b) is a perspective view thereof, and FIG. 3(c) is a plan view thereof as seen from the first face;

FIG. 6(a) is an exploded perspective view of the laminated electronic component, FIG. 6(b) is a perspective view thereof, and FIG. 6(c) is a plan view thereof as seen from the first face;

FIG. 7(a) is a sectional view of the laminated electronic component taken along the line A3-A3 shown in FIG. 6(c), and FIG. 7(b) is a sectional view of the laminated electronic component taken along the line B3-B3 shown in FIG. 6(c);

DESCRIPTION OF EMBODIMENTS

Figure 1:
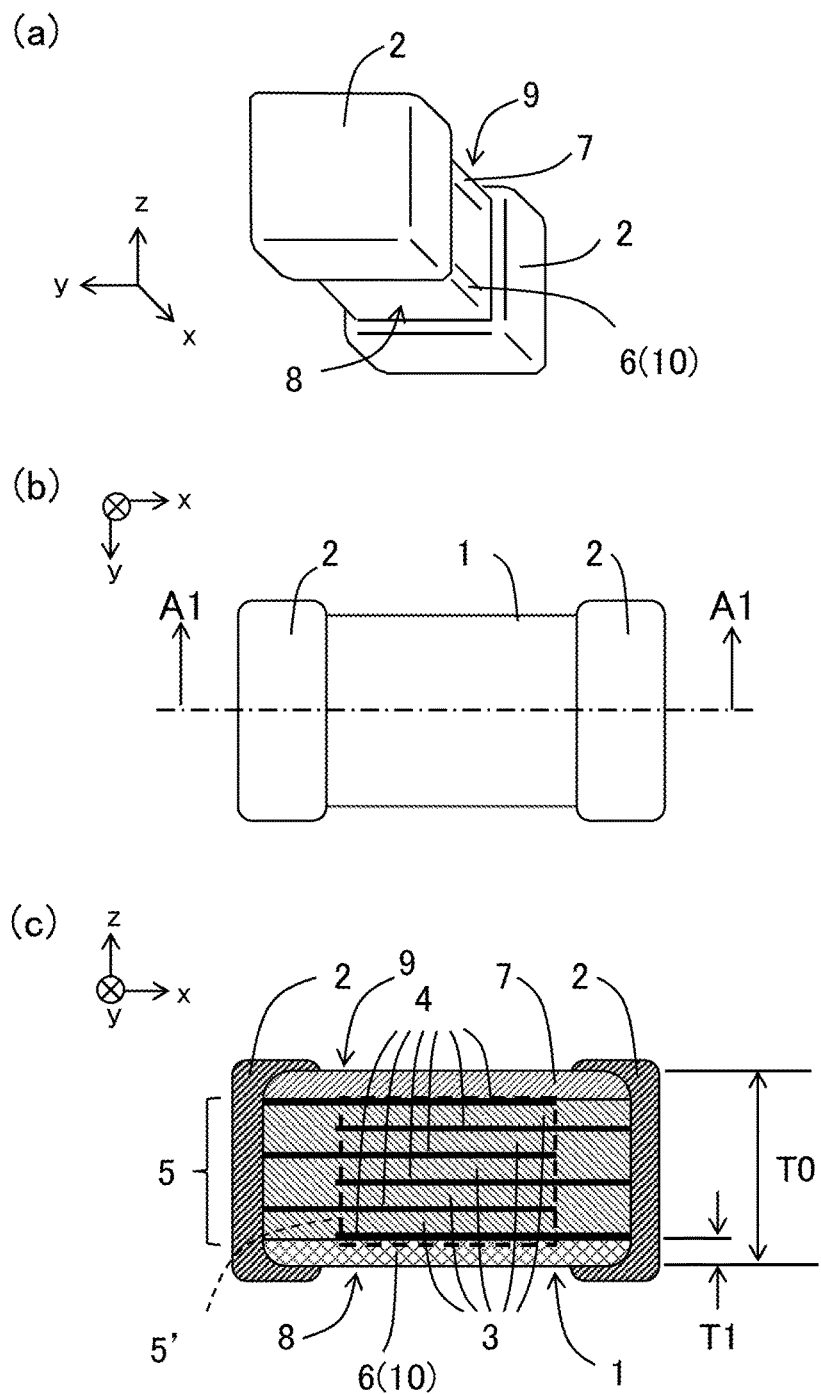
FIG. 1 is a view showing a laminated electronic component according to a first embodiment, and more specifically

A laminated electronic component and a laminated electronic component mounting structure will be described in detail with reference to drawings. Note that like reference characters refer to corresponding members and parts throughout the drawings, and, overlapping descriptions will not be given below. Part of the reference characters may be omitted from some drawings. Moreover, for the sake of facilitating explanation, each drawing bears x-y-z coordinate axes.

(First Embodiment)

As shown in FIGS. 1(*a*) to 1(*c*), a laminated electronic component according to a first embodiment is a laminated capacitor comprising a main body 1 and an external electrode 2 disposed on the outer surface of each end of the main body 1. A stacking direction of the main body 1 coincides with a z-axis direction in the coordinates.

As shown in FIG. 1(*c*), the main body 1 comprises an effective layer 5 in which dielectric layers 3 and internal electrode layers 4 are alternately laminated, and a pair of a first cover layer 6 and a second cover layer 7 which are disposed on opposite sides, respectively, in the stacking direction of the effective layer 5. The effective layer 5 is formed by laminating the dielectric layers 3 and the internal electrode layers 4 alternately so that the internal electrode layer 4 becomes the outermost layer. The internal electrode layer 4 is electrically connected to the external electrode 2 at one of the ends of the main body 1. The internal electrode layers 4 are electrically connected to different external electrodes 2 in an alternate manner. Upon the application of voltage to the external electrodes 2, capacitance is generated in the dielectric layer 3 held between paired internal electrode layers 4 connected to different external electrodes 2. In other words, the effective layer 5 is composed of the internal electrode layers 4 contributing to capacitance generation and the dielectric layer 3 held between the internal electrode layers 4. Note that the structure of the dielectric layers 3 and the internal electrode layers 4 is schematically shown in FIG. 1(*c*), and, in reality, a structure formed of a stack of several to hundreds of dielectric layers 3 and internal electrode layers 4 is generally used. This holds true for other embodiments that will hereafter be described.

The laminated electronic component, which is shaped in a rectangular prism, has a pair of faces composed of a first face 8 located on the first cover layer 6 side and a second face 9 located on the second cover layer 7 side which are opposed to each other in the stacking direction, and four side faces. When the laminated electronic component is viewed from the first face 8, there are the rectangular face of the main body 1 and the faces of the external electrodes 2 located at either end of the main body 1. Although the external electrode 2 protrudes outward beyond the main body 1 in a y-axis direction, the amount of protrusion is far smaller than a width of the main body 1 in the y-axis direction. This holds true for the z-axis direction. Thus, the laminated electronic component having such a configuration is considered to have the shape of a rectangular prism.

In the laminated electronic component according to the present embodiment, the first cover layer 6 is a high-Young's modulus layer 10 which is higher in Young's modulus than the dielectric layer 3. The high-Young's modulus layer 10 may be obtained with use of a material having a composition which is higher in Young's modulus than the composition of a material used for the dielectric layer 3. Moreover, even with use of a material having the same composition as that of the dielectric layer 3, the high-Young's modulus layer 10 may be made higher in Young's modulus than the dielectric layer 3 under the condition that the density of the high-Young's modulus layer 10 is greater than that of the dielectric layer 3.

Young's moduli can be considered to take on material-specific values, and it is thus possible to determine the relationship in Young's modulus value between the dielectric layer 3 and the high-Young's modulus layer 10 by checking the compositions, the crystalline structures, and the densities (porosities) of the materials constituting the dielectric layer 3 and the high-Young's modulus layer 10, respectively. Moreover, the Young's moduli of the dielectric layer 3 and the high-Young's modulus layer 10 may be determined by direct measurement using the nanoindentation method, for example.

Moreover, on an as-needed basis, the Young's moduli of a bulk body made of the material constituting the dielectric layer 3 and a bulk body made of the material constituting the high-Young's modulus layer 10 may be determined by stress-strain measurement under a tensile test, for example.

Moreover, a simulation may be executed on the basis of material data obtained by performing impedance measurement on the laminated electronic component and also analyzing the material compositions, the crystalline structures, and the densities (porosities) of the constituents of the laminated electronic component (the dielectric layer 3, the cover layer, the internal electrode layer 4, the external electrode 2, etc.). It is possible to evaluate the Young's modulus of each constituent with greater accuracy by running a simulation in accordance with a method which will hereafter be described, using material parameters of the bulk bodies made of their respective materials, for the fitting of resonance frequency and band with respect to the impedance.

Such a laminated electronic component may be produced by the following method, for example. First, a green sheet for forming the dielectric layer 3 is prepared by admixing a binder and an organic solvent in raw material powder of a ferroelectric material such as barium titanate to obtain a slurry, and subjecting the slurry to a heretofore known sheet-molding process. On the other hand, a green sheet for forming the high-Young's modulus layer 10 is prepared similarly with use of raw material powder of a paraelectric material such as barium zirconate. Note that, if desired, a sintering aid, or an inorganic compound, which is aimed at adjustment of electrical characteristics and mechanical characteristics or control of a reaction between the dielectric material and an internal-electrode (electrically conductive) material during a sintering process, may be added to the raw material powder.

Then, an internal electrode pattern is formed by applying a conductive material-made paste for forming the internal electrode layer 4 onto the thereby prepared dielectric layer 3-forming green sheet by screen printing or otherwise. Green sheets formed with the internal electrode patterns are laminated on top of each other to obtain a yet-to-be-fired main body for forming the effective layer 5. In addition, a cover sheet is laminated on each side (on the internal electrode pattern) of the yet-to-be-fired main body which forms an effective layer 5 in the stacking direction. At this time, the green sheet which forms a high-Young's modulus layer 10 is used as one of the cover sheets. The cover sheets and the main body are pressed so as to be integral with each other. The yet-to-be-fired main body in a single-piece structure is cut in predetermined dimensions and then fired, whereupon the main body 1 of the laminated electronic component is obtained. The main body may be, if desired, subjected to, for example, barrel polishing either before or after the firing process. The firing temperature is not limited to any particular temperature, but is advisably set to fall in the range of 1000 to 1300° C., for example. In the main body 1 so produced, the dielectric layer 3 is made of ceramic, and, through the firing process, the dielectric layers 3, the internal electrode layers 4, and a pair of cover layers become integral to form the main body in a single-piece structure. One of the paired cover layers constituting the main body 1 is the first cover layer 6 which serves also as the high-Young's modulus layer 10, and the other is the second cover layer 7 made of a material having a Young's modulus which is similar to that of the dielectric layer 3.

Next, an external electrode 2 such as will hereafter be described is formed on the main body 1. Thus, the laminated electronic component according to the present embodiment is obtained.

Figure 2:
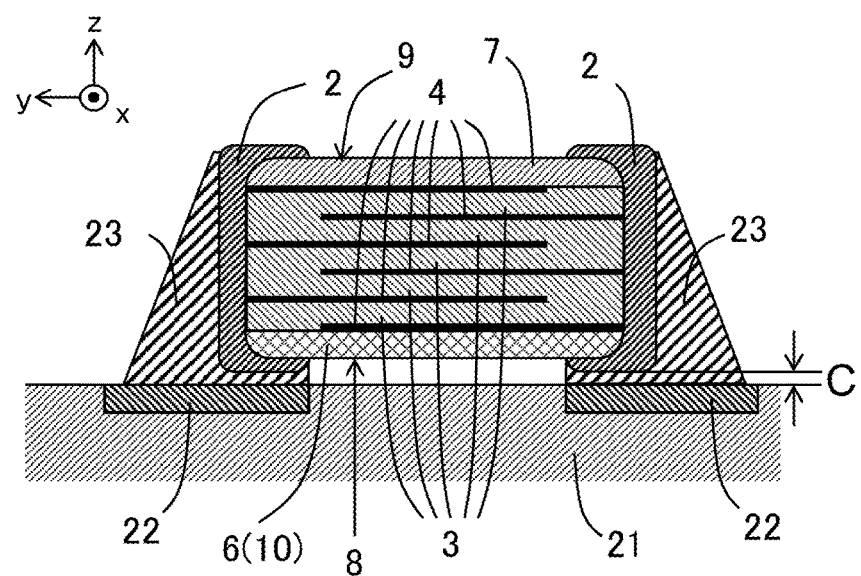
FIG. 2 is a sectional view showing a mounting structure, which is constructed by mounting the laminated electronic component according to the first embodiment on a substrate, taken along the line A1-A1 shown in FIG. 1(b)

The following describes a laminated electronic component mounting structure according to the present embodiment. FIG. 2 is a sectional view of the laminated electronic component mounting structure according to the present embodiment taken along the line A1-A1 drawn in FIG. 1(*b*) showing the laminated electronic component. In the laminated electronic component mounting structure according to the present embodiment, as shown in FIG. 2, the laminated electronic component and a land pattern on a substrate 21 are secured to each other in a state of establishing electrical connection via an electric conductor 23 such as solder. The electric conductor 23 fills a gap between the external electrode 2 and the land pattern 22, and also covers the external electrode 2. The external electrode 2 covers an end of the main body 1 where the internal electrodes are left exposed, and part of the side faces, the upper surface, and the lower surface of the main body 1 which are contiguous to the end. In the present embodiment, it is important that the laminated electronic component and the substrate 21 are joined to each other so that the first cover layer 6 of the laminated electronic component is opposed to the mounting face of the substrate 21, expressed differently, the first face 8 in which the high-Young's modulus layer 10 is located is opposed to the mounting face of the substrate 21.

Figure 9:
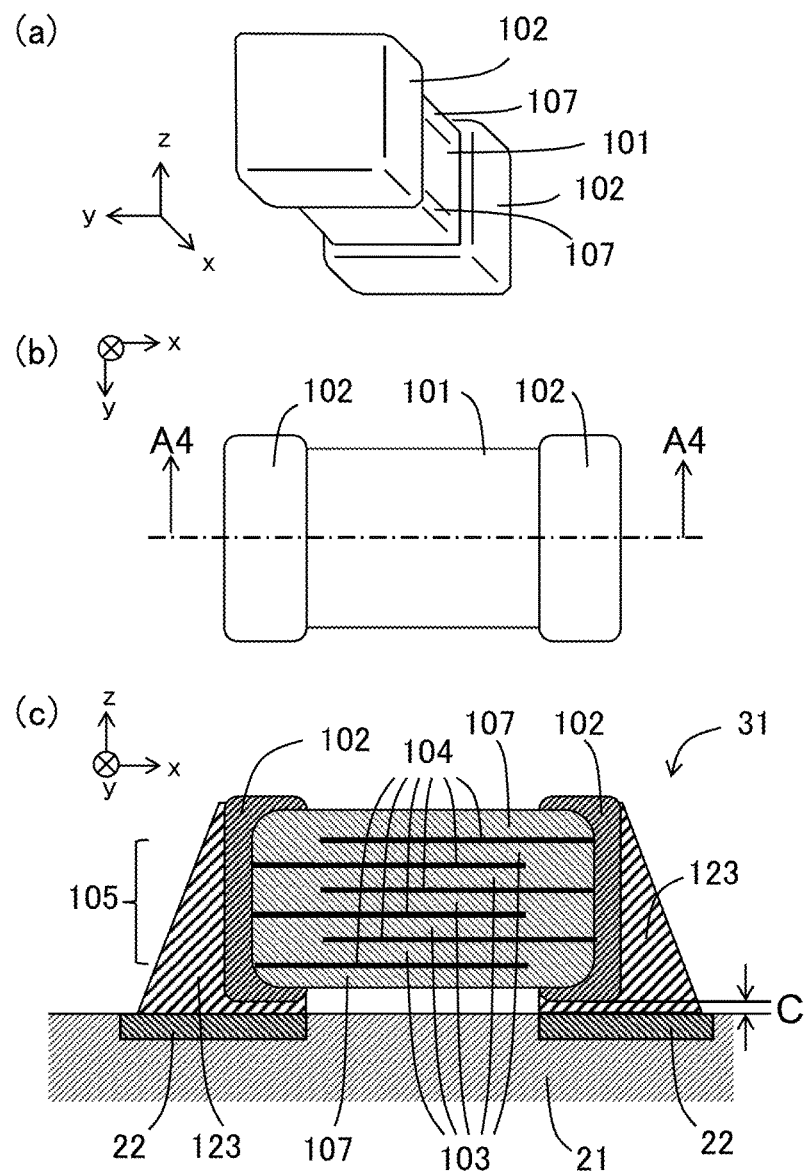
FIG. 9 is a view showing a conventional laminated electronic component, and more specifically FIG. 9(*a*) is a perspective view thereof, FIG. 9(*b*) is a plan view thereof as seen in a z-axis direction in the coordinates, and FIG. 9(*c*) is a sectional view of a conventional mounting structure, which is constructed by mounting the conventional laminated electronic component on a substrate, taken along the line A4-A4 shown in FIG. 9(*b*)

On the other hand, as shown in FIG. 9(*a*), a conventional laminated electronic component comprises a main body 101 shaped in a rectangular prism and an external electrode 102 disposed on the outer surface of each end of the main body 101. FIG. 9(*b*) is a plan view of the conventional laminated electronic component as seen in the z-axis direction indicated in FIG. 9(*a*). FIG. 9(*c*) is a sectional view of the conventional laminated electronic component mounted on the substrate 21 taken along the line A4-A4 drawn in FIG. 9(*b*) showing the laminated electronic component.

As shown in FIG. 9(*c*), the main body 101 comprises an effective layer 105 in which dielectric layers 103 and internal electrode layers 104 are alternately laminated, and paired cover layers 107 disposed on opposite sides, respectively, in the stacking direction of the effective layer 105. However, in contrast to the present embodiment, this construction is not provided with the high-Young's modulus layer 10. The internal electrode layer 104 is electrically connected to the external electrode 102 at one of the ends of the main body 1.

For example, in a laminated ceramic capacitor which is one of laminated electronic components, a material having ferroelectricity such as barium titanate is used for the dielectric layer 103, and, a metal material such as Ni is used for the internal electrode layer 104. Moreover, in general, the external electrode 102 in use is obtained by baking a Cu paste into a base electrode, and plating its surface with Ni and Sn.

In the conventional laminated electronic component, as shown in FIG. 9(*c*), the external electrode 102 and the land pattern 22 on the substrate 21 are secured to each other in electrically connecting relation via an electric conductor 123 such as solder (hereafter referred to as "solder 123"). The solder 123 fills a gap between the external electrode 102 and the land pattern 22, and also covers the external electrode 102. The external electrode 102 covers an end of the main body 101 where the internal electrode layers 104 are left exposed, and part of the side faces, the upper surface, and the lower surface of the main body that are contiguous to the end.

When DC voltage (DC bias) and AC voltage are simultaneously applied to the laminated ceramic capacitor so mounted, then piezoelectric properties are imparted to the dielectric layer 103 due to the application of DC voltage to the dielectric layer 103 which exhibits electrostrictive effect, with consequent generation of piezoelectric vibration under AC voltage. Furthermore, the piezoelectric vibration of the laminated ceramic capacitor is transmitted, through the solder 123, to the substrate 21, causing vibration in the substrate 21. Consequently, when resonance occurs in the substrate 21 at a resonance frequency in an audio frequency range, vibration sound is generated. This phenomenon is known as "acoustic noise".

By way of example, acoustic noise measurement was made on a conventional mounting structure constructed by mounting a laminated ceramic capacitor, which is the conventional laminated electronic component, on the substrate 21. In the measurement, a laminated ceramic capacitor of Type 1005 (10 µF in capacitance, 4 V in rated voltage), which will hereafter be also referred to as "evaluation component", was used as the laminated ceramic capacitor, and, a glass epoxy substrate made of an FR4 (Flame Retardant Type 4) material which has a dimension of 100× 40 mm, and a thickness of 0.8 mm was used as the substrate 21. The laminated ceramic capacitor was disposed centrally of the substrate 21 with use of Sn—Ag—Cu (SAC)-based solder. After mounting the evaluation component on the substrate 21, the condition of the mounting has been observed by a microscope. The result of observation has showed that the fillet height of the solder 123 is 460 µm and a distance C between the substrate 21 and the evaluation component is 45 µm.

Figure 10:
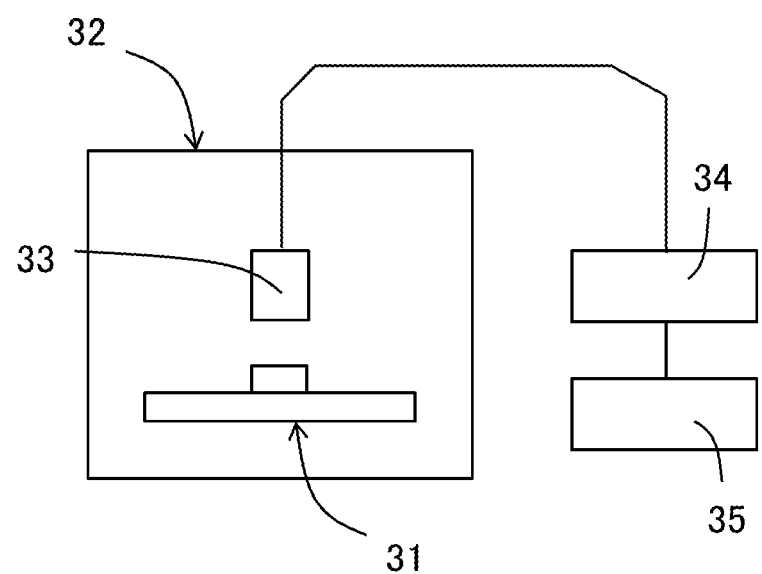
FIG. 10 is a schematic representation of a sound-pressure level measuring apparatus.

The acoustic noise measurement has been conducted by a sound-pressure level measuring instrument as shown in FIG. 10. A mounting substrate 31 constructed of the evaluation component mounted on the substrate 21 (hereafter also referred to simply as "mounting substrate") was placed in an anechoic box having an inside dimension of 600×700 mm, and a height of 600 mm, and, a sound-collecting microphone 33 was set in a position spaced a distance of 3 mm away from the center of the substrate 21 in a direction perpendicular to the substrate 21. Sound resulting from acoustic noise was collected by the sound-collecting microphone 33, and, the sound pressure level of the collected sound was measured by an amplifier 34 and an FET analyzer 35 (Model DS2100 manufactured by ONO SOKKI Co., LTD). The laminated ceramic capacitor received application of DC voltage (DC bias) of 4 V and AC voltage of 1 Vp-p within the range of 20 Hz to 20 kHz. The result of acoustic noise measurement obtained at this time is shown in FIG. 11(a).

Figure 11:
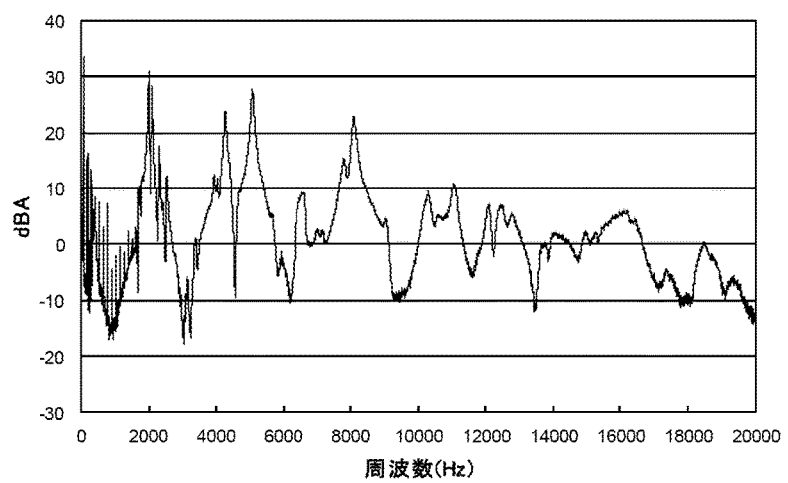
FIG. 11 is a graph indicating the sound pressure level of sound resulting from acoustic noise in a conventional laminated ceramic capacitor, and more specifically FIG. 11(*a*) is a graph indicating an actually measured sound pressure level, and FIG. 11(*b*) is a graph indicating a sound pressure level obtained by simulation.
Figure 11:
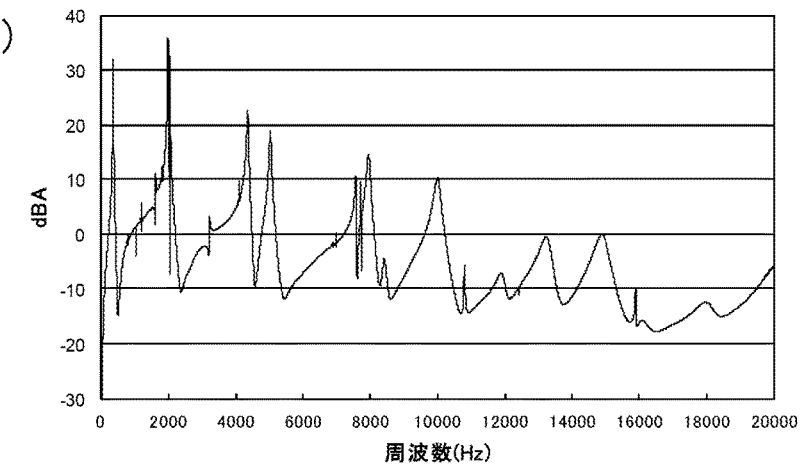

In FIG. 11(a), sound pressure levels are represented as A-weighted sound pressure levels (dBA). An A-weighted sound pressure level of 0 dBA is equivalent to the lowest sound pressure level of audible sound that can be perceived by human beings. The A-weighted sound pressure level refers to a sound pressure level weighted on a frequency-by-frequency basis so as to be close to the level of human hearing, which is described in Specifications for Sound Level Meters (Noise Level Meters) (JIS C 1509-1: 2005).

Figure 12:
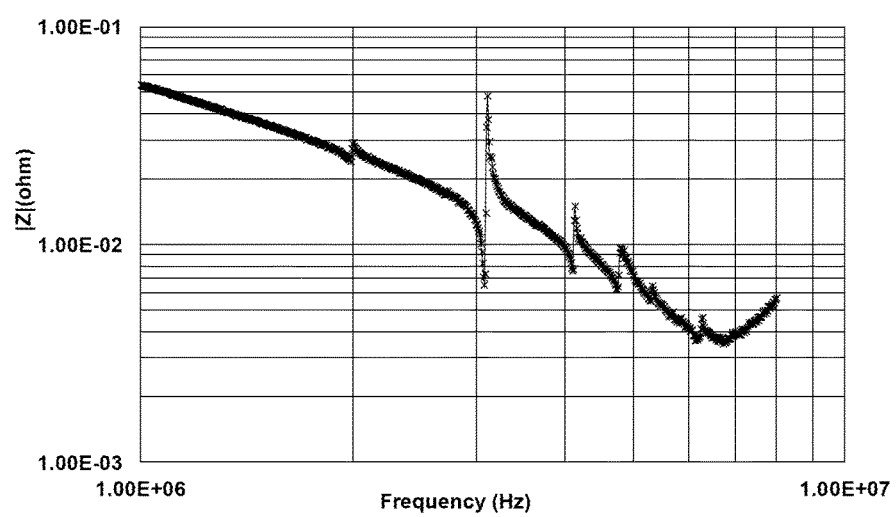
FIG. 12 is a graph indicating the result of impedance measurement made on a unitary conventional laminated ceramic capacitor subjected to application of DC bias of 4 V.

Next, simulation was made on the conventional laminated ceramic capacitor in respect of piezoelectric vibration. To begin with, impedance measurement was made on the evaluation component under applied DC voltage (DC bias) of 4 V. The result of the measurement is shown in FIG. 12.

Figure 13:
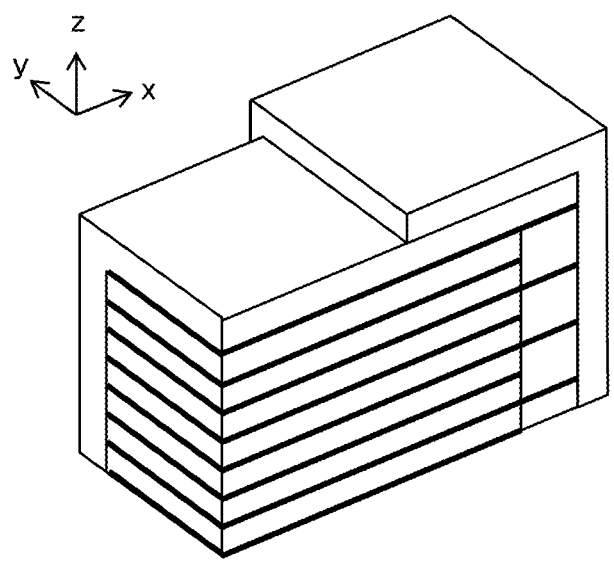
FIG. 13 is a schematic view of a model based on the finite element method used for the simulation for impedance made on the conventional laminated ceramic capacitor.

Moreover, simulation was made on a model based on the evaluation component (dielectric material: barium titanate-based material, internal electrode: Ni, external electrode: Cu, main body dimensions: 1100×620×620 µm, external electrode thickness: 20 µm) in respect of impedance. Material parameter fitting was performed on the evaluation component so that a peak of piezoelectric resonance as found in a range of frequencies of 2 GHz and above conforms to the actually measured value. FIG. 13 is a view schematically showing the model based on the finite element method used for the simulation for impedance. This model is a one-eighth scale model built with consideration given to symmetry, in which two sections and lower sections that appear to the front in FIG. 13 define the plane of symmetry.

Parameters (elastic stiffness $c_{ij}$ and piezoelectric constant $e_{ij}$) of the dielectric layer 103 obtained by the fitting are shown in Table 1. It will be seen from Table 1 that the material characteristics of the dielectric layer 103 of the evaluation component involve anisotropy ($c_{11} > c_{33}$, and $c_{22} > c_{33}$). This is ascribable to compressive stress exerted by the internal electrode layer 104.

TABLE 1

| Elastic stiffness and Piezoelectric constant of Dielectric layer | |
| --- | --- |
| $c_{11}^E$ | $281.5 \times 10^9$ N/m² |
| $c_{12}^E$ | $117.2 \times 10^9$ N/m² |
| $c_{13}^E$ | $57.2 \times 10^9$ N/m² |
| $c_{22}^E$ | $230.8 \times 10^9$ N/m² |
| $c_{23}^E$ | $57.2 \times 10^9$ N/m² |
| $c_{33}^E$ | $104.3 \times 10^9$ N/m² |
| $c_{44}^E$ | $30.9 \times 10^9$ N/m² |
| $c_{55}^E$ | $30.9 \times 10^9$ N/m² |
| $c_{66}^E$ | $68.9 \times 10^9$ N/m² |
| $e_{31}$ | $-22.2$ C/m² |
| $e_{32}$ | $-27.8$ C/m² |
| $e_{33}$ | $4.75$ C/m² |
| $e_{15}$ | $2.94$ C/m² |
| $e_{24}$ | $2.94$ C/m² |

A model of the mounting structure was formed on the basis of the thereby obtained parameters of the dielectric layer 103 and the mounting substrate 31 used for measurement (fillet height: 460 µm, substrate-to-evaluation component distance: 45 µm), and simulation was made on this model. FIG. 11(b) is a graph indicating the amplitude of vibration, expressed in terms of A-weighted sound pressure level, in the mounting substrate 31 obtained by the simulation. Acoustic noise frequency characteristics are dependent on the vibration characteristics of the evaluation component and the resonant mode of the mounting substrate 31. Thus, the simulation result shown in FIG. 11(b) has indicated that the values of each of sound pressure level and frequency characteristics are in good agreement with the corresponding actually measured values shown in FIG. 11(a) in a range of low frequencies of 10 kHz and below characterized by particularly high sound pressure. Accordingly, simulation using the parameters makes it possible to examine influences on acoustic noise entailed by changes in the mounting structure and in the structure of the evaluation component in itself.

Figure 14:
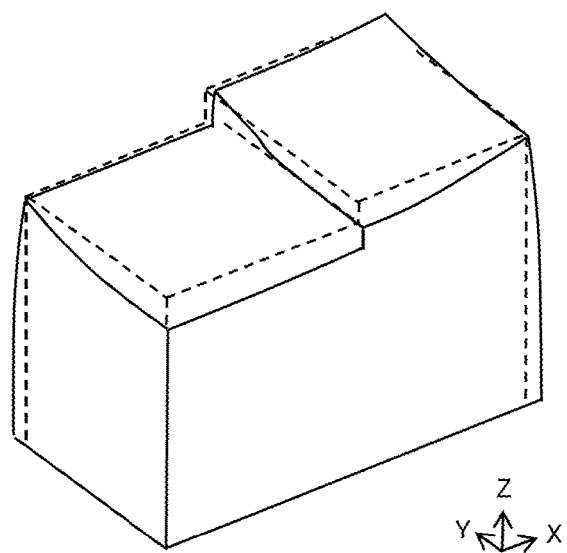
FIG. 14 is a perspective view showing the result of calculation as to a vibration mode at 10 kHz in the unitary conventional laminated ceramic capacitor, and more specifically FIG. 14(*a*) is a view of the model as seen from the plane of symmetry thereof, and FIG. 14(*b*) is a view of the model as seen from a surface thereof.
Figure 14:
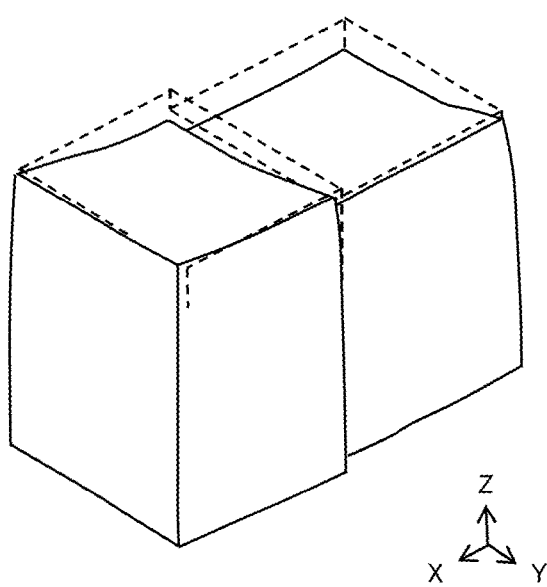

Moreover, with use of the above-mentioned one-eighth scale model, a vibration mode of the evaluation component in an audio frequency range (the range of 20 Hz to 20 kHz) was determined by calculation using the thereby obtained parameters. The result of calculation at 10 kHz is shown in FIG. 14. FIG. 14(a) is a view of the one-eighth scale model as seen from the inner side (from the plane of symmetry) thereof, and FIG. 14(b) is a view of the one-eighth scale model as seen from the opposite side of the model from the side shown in FIG. 14(a), in other words, from the outer side (the surface) thereof. In the drawings, broken lines represent the shape of the evaluation component which is yet to be subjected to AC voltage application, and solid lines represent the shape of the evaluation component in a condition of undergoing maximum displacement under applied AC voltage. It will be seen from this result that the evaluation component undergoes spreading vibration in the direction of the plane of stacked layers, and also undergoes expansive-contractive vibration in the thickness direction (stacking direction) in an audio frequency range.

Thus, a laminated electronic component designed to reduce spreading vibration in the direction of the plane of stacked layers is believed to be able to restrain transmission of the piezoelectric vibration of the laminated electronic component to the substrate 21 when mounted on the substrate 21, and thus suppress acoustic noise.

To reduce spreading vibration in the direction of the plane of stacked layers, as practiced in the present embodiment shown in FIGS. 1 and 2, there is provided the high-Young's modulus layer 10 which is higher in Young's modulus than the dielectric layer 3 as the first cover layer 6 of the main body 1, and, the laminated electronic component is mounted on the substrate 21 so that the first cover layer 6 is opposed to the mounting face of the substrate 21. By virtue of the high-Young's modulus layer 10, spreading vibration of the laminated electronic component on a first face 8 side to be secured to the substrate 21, can be reduced, thus achieving suppression of acoustic noise.

Acoustic noise simulation was made on the following model of the present embodiment. The conditions to be fulfilled by the main body 1 and the external electrode 2 are similar to those adopted in the acoustic noise simulation made on the evaluation component as described above (dielectric material: barium titanate-based material, internal electrode: Ni, external electrode: Cu, main body dimensions: 1100×620×620 μm, external electrode thickness: 20 μm). However, in this case, $BaZrO_3$ (whose Young's modulus is 220 GPa) was used as the material for the high-Young's modulus layer 10, and, a thickness T1 of the high-Young's modulus layer 10 was set at 155 μm. According to the result obtained by averaging the data obtained in the simulation throughout a frequency range of 5 Hz to 20 kHz, a 5 dBA reduction in the mean of sound pressure level was achieved in the present embodiment as contrasted to the case with the above-described evaluation component.

It is preferable that the second cover layer 7 has a Young's modulus which is less than or equal to the Young's modulus of the dielectric layer 3. In this case, a certain degree of freedom of spreading vibration in the laminated electronic component is left on a second face 9 side thereof which is not secured to the substrate 21, wherefore vibration energy tends to be concentrated on the second face 9 side of the laminated electronic component. This makes it possible to achieve further reduction in spreading vibration at the first face 8 side of the laminated electronic component. As the material having a Young's modulus less than or equal to the Young's modulus of the dielectric layer 3, use can be made of a material which is lower in Young's modulus than the material for the dielectric layer 3, for example, insulating resins of various type. In the case where the second cover layer 7 is formed integrally with the effective layer 5 and the first cover layer 6 in a single-piece structure through firing process, for example, a material which is identical in composition with the dielectric layer 3 and yet is lower in density (higher in porosity) than the dielectric layer 3 may be used.

Although the first cover layer 6 and the second cover layer 7 may be bonded to the effective layer 5 via an adhesive or the like, from the standpoints of resistance to moisture and reliability, the first and second cover layers should preferably be joined directly to the effective layer 5 by firing so that they are integral to form the main body 1 in a single-piece structure. The direct joining of the first cover layer 6 and the second cover layer 7 (that may also be referred to simply as "cover layer") to the effective layer 5 means that an intermediary layer, such as an adhesive, is not positively provided at the interface of the effective layer 5 and the cover layer. In cases where the cover layer is made of a material which differs from the material for the effective layer 5, a reaction layer or a diffusion layer may be created at the interface of the effective layer 5 and the cover layer. Even if such a reaction layer or diffusion layer exists, the cover layer is considered to be joined directly to the effective layer 5.

Figure 15:
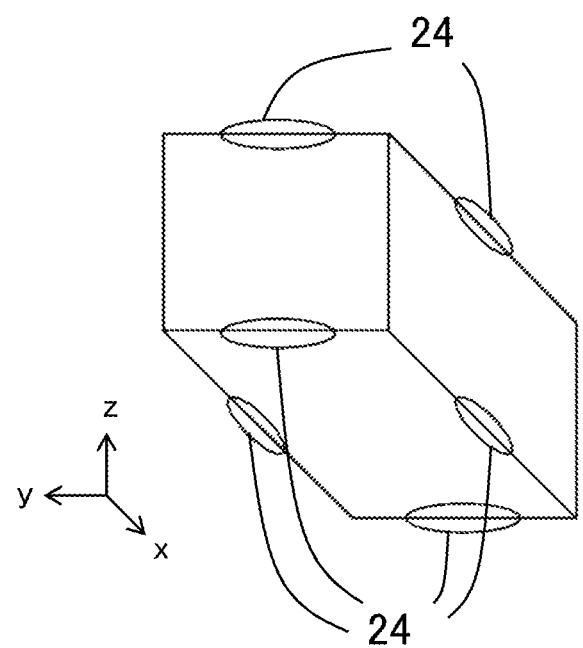
FIG. 15 is a perspective view schematically showing vibration nodes in a vibration mode in the unitary conventional laminated ceramic capacitor.

Moreover, as will be seen from FIG. 15 which is a view schematically showing the evaluation component as a whole, on the paired faces opposed to each other in the stacking direction of the evaluation component, there is a region exhibiting low vibration amplitude, in other words, a region in the form of a node of vibration (hereafter referred to as "nodal portion 24") located near a midpoint of each side defining the face.

As shown in FIG. 1(c), in the stacking direction of the main body 1, the ratio of T1 to T0 (T1/T0) should preferably be greater than or equal to 0.1, where T0 is a thickness of the main body 1 and T1 is a thickness of the high-Young's modulus layer 10. In the case where the ratio T1/T0 is greater than or equal to 0.1, it is possible to increase the rigidity of the high-Young's modulus layer 10 effectively, and thereby reduce vibration at the first face 8 side. It is preferable that T1 is less than or equal to one third in the interest of minimizing problems such as occurrence of cracking resulting from a difference in firing-induced shrinkage or thermal expansion coefficient in the production of the entire main body 1 including the high-Young's modulus layer 10 through simultaneous firing process, and also achieving concentration of vibration energy on the second face 9 side.

Although the description as to the present embodiment deals with the case where the entire first cover layer 6 is the high-Young's modulus layer 10, the high-Young's modulus layer 10 may be formed of part of the first cover layer 6. For example, the high-Young's modulus layer 10 may be an outermost layer of the main body 1 located at the first face 8 side thereof, or, another layer may additionally be provided outside of the high-Young's modulus layer 10.

Moreover, when, in the effective layer 5, a region where the internal electrodes 3 connected to different external electrodes 2 are disposed in overlapping relation in the stacking direction (for example, a capacitance-generating region in capacitor's case) is an effective section 5' (indicated by broken lines in FIG. 1(c)), on a plane of projection perpendicular to the stacking direction, the effective section 5' is located within the contour of the high-Young's modulus layer 10. In other words, the contour of the high-Young's modulus layer 10 is located in an annular form between the contour of the main body 1 and the contour of the effective section 5'. The vibration of the laminated electronic component results from piezoelectric vibration generated under AC voltage in the condition where piezoelectric properties are imparted to the dielectric layer 3 due to the application of DC voltage to the dielectric layer 3 which exhibits electrostrictive effect. That is, a stress developed in the spreading direction by piezoelectric effect is found in, out of the effective layer 5, the effective section 5' subjected to voltage application. Thus, by setting the effective section 5', which is a source of piezoelectric vibration generation, under restraint by the high-Young's modulus layer 10, expressed differently, by making the first cover layer 8, or at least a region thereof opposed to the effective section 5', as the high-Young's modulus layer 10, it is possible to obtain acoustic noise suppression effect.

It is preferable that the ratio of E1 to E0 (E1/E0) is greater than or equal to 1.4, where E0 is a Young's modulus of the dielectric layer 3 and E1 is a Young's modulus of the high-Young's modulus layer 10. In the case where E1/E0 is greater than or equal to 1.4, the high-Young's modulus layer 10 is higher in Young's modulus than the effective layer 5 composed of a composite of the dielectric layers 3 and the internal electrode layers 4 having relatively high Young's modulus, thus reducing vibration at the first face 8 side of the laminated electronic component. It is preferable that E1/E0 is less than or equal to 3.0 in the interest of minimizing problems such as cracking in the production of the entire main body 1 including the high-Young's modulus layer 10 through simultaneous firing process.

The present embodiment, while being especially desirable for use for a laminated ceramic capacitor in which a ferroelectric material such as a barium titanate-based material is used for the dielectric layer 3 and a metal material such as Ni, Cu, Ag, or a Ag—Pd alloy is used for the internal electrode layer 4, may be applicable to another laminated electronic component in cases where, for example, there is a need to suppress excitation of the substrate 21 installed with the laminated electronic component and so forth caused by piezoelectric vibration of the laminated electronic component in itself. The present embodiment affords remarkable effects when applied to a laminated electronic component of Type 1005 or larger.

A paraelectric material having sinterability and thermal expansion coefficient substantially equal to those of the material for the dielectric layer 3 may be used for the high-Young's modulus layer 10. The paraelectric material is higher in Young's modulus than the ferroelectric material. Accordingly, for example, in the case of using a barium titanate-based ferroelectric material for the dielectric layer 3, a paraelectric material which has, like barium titanate, a perovskite crystalline structure, such as a barium zirconate-based material or a calcium zirconate-based material, may be used for the high-Young's modulus layer 10. Moreover, use can be made of a material obtained by mixing a ferroelectric material which is identical with or equivalent to the material constituting the dielectric layer 3, with a metal material such as Ni which is an electrically-conductive material constituting the internal electrode layer 4. The metal material such as Ni has a relatively higher Young's modulus than that of the ferroelectric material, and thus such a mixture material, so long as it is obtained by mixing those materials so that the proportion of the metal material therein is greater than that in the material for the effective layer 5, may be used as the material for the high-Young's modulus layer 10. That is, the high-Young's modulus layer 10 may either consist solely of one material or be made of a mixture of a plurality of materials. Moreover, the high-Young's modulus layer 10 may either be a single layer or be composed of a plurality of layers made of the same material or different materials. In either case, it is sufficient that the first cover layer 6 located on the first face 8 side beyond the effective layer 5 in the main body 1 includes the high-Young's modulus layer 10 having a Young's modulus which is higher than the average Young's modulus of the entire effective layer 5.

The laminated electronic component according to the present embodiment is equal in external form to the conventional laminated electronic component, wherefore there is no need for substantial design changes. Thus, the present embodiment is applicable to a variety of existing laminated electronic components. Another advantage is that the present embodiment does not necessitate a specially prepared jig for its installation on the substrate.

Although the above description as to the present embodiment deals with, as an example of laminated electronic components, a typically structured laminated ceramic capacitor having the external electrode 2 at each longitudinal end, the present embodiment is applicable to other laminated electronic components of various structures, including, for example, a low-profile type, a so-called LW reverse type, and a multiple terminal type.

Moreover, for example, although many laminated ceramic capacitors employ, as the external electrode 2, a component composed of a Cu-made base electrode plated with Ni and Sn, the present embodiment is also applicable to a component having the external electrode 2 composed solely of a plating electrode without using a base electrode. The Cu-made base electrode is relatively soft, wherefore the base electrode absorbs piezoelectric vibration of the main body 1 to a certain extent for attenuation, thus achieving suppression of acoustic noise. On the other hand, in the case where the external electrode 2 is composed solely of a plating electrode, piezoelectric vibration of the main body 1 is not attenuated in the external electrode 2, causing appreciable acoustic noise. Accordingly, the application of the present embodiment to a component having the external electrode 2 composed solely of a plating electrode makes it possible to attain even higher acoustic noise suppression effect.

(Second Embodiment)

Figure 3:
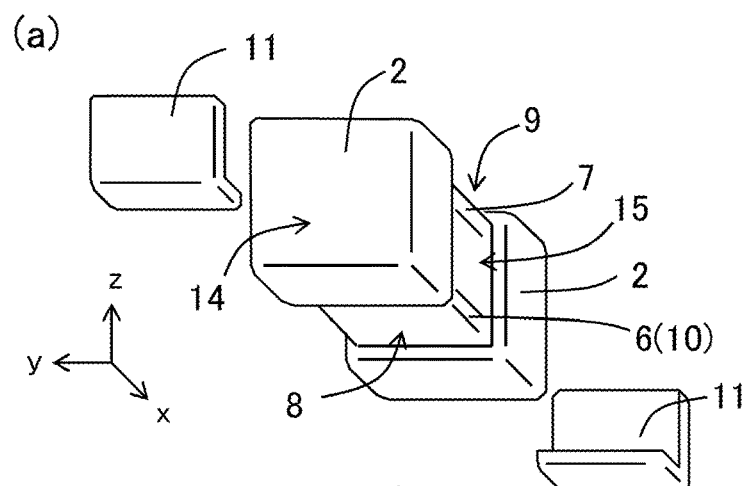
FIG. 3 is a view showing a laminated electronic component according to a second embodiment, and more specifically
Figure 3:
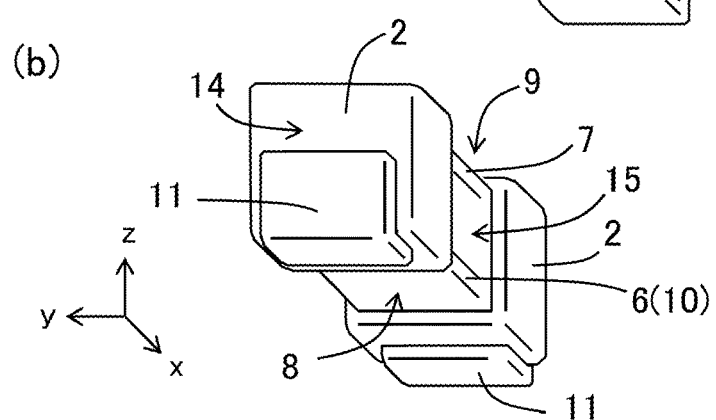
Figure 3:
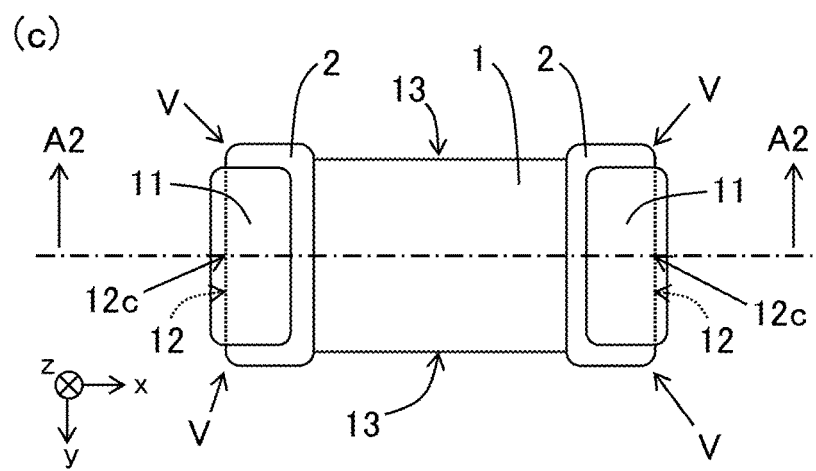

In a second embodiment, as shown in FIGS. 3($a$) to 3($c$), there is further provided a joining member 11 located on a first face 8-side part of the external electrode 2 as provided in the foregoing first embodiment. Also in the present embodiment, like the first embodiment, the first cover layer 6 comprises a high-Young's modulus layer 10 which is higher in Young's modulus than the dielectric layer 3.

In the present embodiment, the first face 8 is rectangular-shaped, is defined by the main body 1 and the external electrode 2, and has two pairs of opposed sides and vertices V. In other words, when the laminated electronic component is seen in a plan view from the first face 8, the two pairs of opposed sides and the vertices V define a contour formed by the main body 1 of the laminated electronic component and the external electrode 2. Although, in the contour, the sides of the external electrode 2 protrude outward beyond the sides of the main body 1, the amount of protrusion is far smaller than the length of each side. Thus, such a face is considered to have a rectangular shape. In this construction, one pair of the two pairs of sides is represented as a pair of first sides 12, and the other pair is represented as a pair of second sides 13. Moreover, a pair of side faces which are contiguous to the first face 8 through the corresponding first sides 12 is represented as a pair of first side faces 14, and a pair of side faces which are contiguous to the first face 8 through the corresponding second sides 13 is represented as a pair of second side faces 15.

The laminated electronic component according to the present embodiment comprises a pair of joining members 11 which extend over the corresponding one of the paired first sides 12, and also over a region in the first face 8 which is close to the first side 12 and a region in the first side face 14 which is close to the first side 12. The second side 13 and the second side face 15 are free of the joining member 11.

Moreover, it is preferable that the joining member 11 is located in an area which includes a midpoint 12$c$ of the first side 12 but does not include the vertex V. The midpoint 12$c$ of the first side 12 corresponds to a bisection point in which the length of the first side 12 is bisected.

Figure 4:
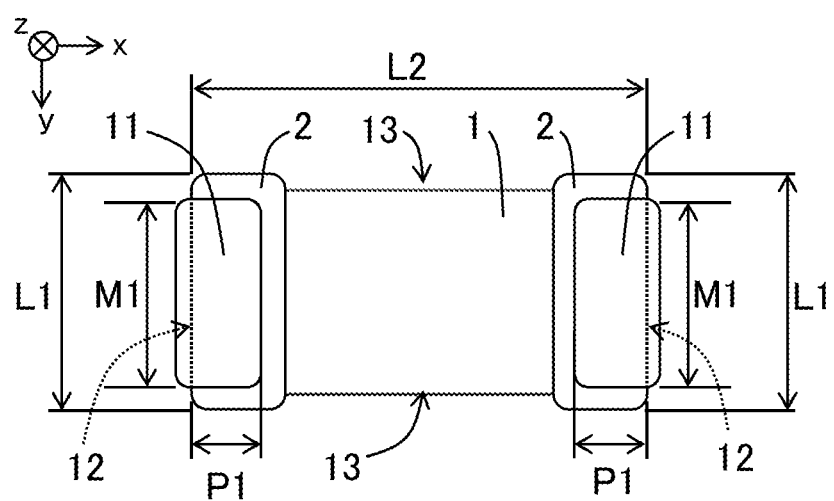
FIG. 4 is a plan view of the laminated electronic component according to the second embodiment, illustrating dimensions of each constituent thereof as seen from the first face.

In the present embodiment, as shown in FIG. 4, it is preferable that L1 <L2, where L1 is a length of the first side 12 and L2 is a length of the second side 13. L1 and L2 represent the lengths of the laminated electronic component which comprises the main body 1 and the external electrode 2 and yet does not include the joining member 11, in other words, the lengths of the laminated electronic component exclusive of the joining member 11, as seen in a plan view from the first face 8. In the laminated electronic component comprising the main body 1 and the external electrode 2 that have typical shapes, L1 and L2 can be considered to represent the outside dimensions of the main body 1 and the external electrode 2.

Although, in FIGS. 3 and 4, there is shown the case where the joining member 11 is formed so as to extend over the first side 12, and also over the region in the first face 8 which is close to the first side 12 and the region in the first side face 14 which is close to the first side 12, the joining member 11 may be spaced away from the first side 12. In this case, the joining member 11 is disposed on the region in the first face 8 or the first side face 14 which is close to the first side 12.

Thus, the laminated electronic component is mounted, at its areas corresponding to the opposed two sides of the first face 8 (first sides 12) and at least one of the first-face 8 regions close to the corresponding two sides and the first-side-face 14 regions close to the corresponding two sides, on the substrate 21 via the joining members 11, whereby acoustic noise suppression effect can be attained. That is, the laminated electronic component is secured, at its nodal portions 24 as shown in FIG. 15, to the substrate 21 via the joining members 11, whereby piezoelectric vibration of the laminated electronic component in itself is restrained against propagation through the substrate 21, thus suppressing acoustic noise.

As shown in FIG. 4, M1 is a length of the joining member 11 in the direction of length of the first side 12, and P1 is a length of a part of the joining member 11 on the first face 8 of the laminated electronic component which extends from the first side 12 toward the center of the first face 8 in a direction perpendicular to the first side 12.

Figure 5:
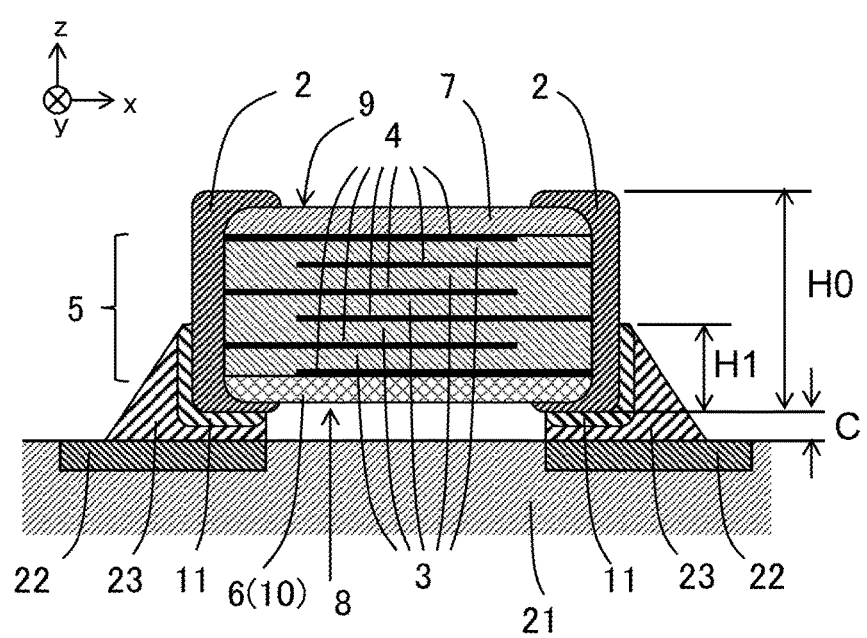
FIG. 5 is a sectional view showing a mounting structure, which is constructed by mounting the laminated electronic component according to the second embodiment on a substrate, taken along the line A2-A2 shown in FIG. 3(c)

Moreover, as shown in FIG. 5, H0 is a height of the laminated electronic component comprising the main body 1 and the external electrode 2 in the stacking direction of the main body 1, H1 is a length of a part of the joining member 11 on the first side face 14 which extends from the first side 12 toward the center of the first side face 14 in the stacking direction, and C is a distance between the mounting face of the substrate 21 and the external electrode 2.

Thus, the paired joining members 11 in the present embodiment are formed on the surfaces of different external electrodes 2, and have electrical conductivity. As the material for the joining member 11, use can be made of, for example, a brazing material such as eutectic solder or lead-free solder (Sn—Ag—Cu solder), and conductive adhesives.

For example, the joining member 11 may be formed by printing a solder paste onto a predetermined area of the first face 8-side part of the external electrode 2, performing heat treatment at a temperature at which the solder is melted, and performing a cooling process. As an alternative, a solder ball is bonded to the predetermined area of the first face 8-side part of the external electrode 2 with use of a flux or low-melting-point solder. Note that solder in solid form used as the joining member 11 does not necessarily have to be a spherical solder ball, and may thus be solder of another shape such as plate-like solder, rod-like solder, or linear solder. Moreover, an arrangement of a plurality of solder balls of spherical or other shape may be used for the joining member 11. In addition, in the case of using an electrically-conductive paste for the formation of the joining member 11, the joining member 11 may be formed by printing the paste onto the predetermined area of the first face 8-side part of the external electrode 2 by screen printing or otherwise, and then performing a drying process. The joining member 11 may be disposed not only on the first face 8-side part of the external electrode 2 but also on the main body 1, and may also be disposed so as to extend over the external electrode 2 and also over the main body 1.

The following describes a laminated electronic component mounting structure according to the present embodiment. In the laminated electronic component mounting structure according to the present embodiment, as shown in FIG. 5, the external electrode 2 of the laminated electronic component and the land pattern 22 on the substrate 21 are joined to each other via the joining member 11 so that the first face 8 and the mounting face of the substrate 21 are opposed to each other. The joining member 11 in the present embodiment serves to join the laminated electronic component to the substrate 21, as well as to provide electrical connection between the external electrode 2 of the laminated electronic component and a circuit (not shown) of the substrate 21.

In mounting the laminated electronic component on the substrate 21, the laminated electronic component may be joined directly to the land pattern 22 of the substrate 21 by the joining member 11, or, the laminated electronic component may be mounted on the substrate 21 via an electrically-conductive material such as solder applied onto the land pattern 22 of the substrate 21. In the latter case, the solder or the like applied onto the land pattern 22 constitutes a conductor 23 located between the joining member 11 and the land pattern 22. The conductor 23 is formed so as to make contact with or cover the joining member 11. It is preferable that the conductor 23 and the external electrode 2 are joined to each other via the joining member 11 to avoid direct contact between the conductor 23 and the external electrode 2. By joining the conductor 23 and the external electrode 2 together via the joining member 11, it is possible to join the laminated electronic component, at its area provided with the joining member 11, to the land pattern 22 of the substrate 21. In the case of mounting the laminated electronic component on the substrate 21 bearing the conductive material as described above, although it is desirable to use the same material as that used for the joining member 11 as the conductive material, use can be made of any material which exhibits good wettability to the joining member 11 without limitation.

Acoustic noise simulation was made on the following model of the present embodiment. The conditions to be fulfilled by the main body 1 and the external electrode 2 are similar to those adopted in the acoustic noise simulation made on the evaluation component as described above (dielectric material: barium titanate-based material, internal electrode: Ni, external electrode: Cu, main body dimensions: 1100×620×620 μm, external electrode thickness: 20 μm). However, in this case, $BaZrO_3$ (whose Young's modulus is 220 GPa) was used as the material for the high-Young's modulus layer 10, and, the thickness T1 of the high-Young's modulus layer 10 was set at 155 μm. Moreover, in the first face 8, a pair of its sides which are 660 μm long is represented as a pair of first sides 12, and a pair of another sides which are 1140 μm long is represented as a pair of second sides 13.

In the joining member 11, M1 was set at 620 μm, P1 was set at 160 μm, and H1 was set at 78 μm. Moreover, C in the mounting structure according to the present embodiment was set at 140 μm. According to the result obtained by averaging the simulation data throughout a frequency range of 5 Hz to 20 kHz, a 19 dBA reduction in the mean of sound pressure level was achieved in the present embodiment as contrasted to the above-described evaluation component, viz., the conventional mounting structure.

Although the ratio of M1 (620 μm) to L1 (660 μm) (M1/L1) was set at 0.94 in this simulation, by setting the ratio at 0.5, and disposing the joining member 11 in a nodal portion 24—including region of the first side 12, it is possible to achieve a 22 dBA reduction in sound pressure level as contrasted to the conventional case. From mountability standpoint, it is preferable that M1/L1 is greater than or equal to 0.4.

Moreover, although the ratio of H1 (78 μm) to H0 (660 μm) (H1/H0) was set at 0.12 in this simulation, even if the ratio is set at 0.5, a 10 dBA reduction in sound pressure level can be achieved as contrasted to the conventional case.

Moreover, the result of vibration mode analysis made on the above-described evaluation component has showed that a region around the center of each surface constituting the evaluation component exhibits great vibration amplitude. It is thus preferable that the ratio of H1 to H0 (H1/H0) is less than or equal to 0.4, and that the ratio of P1 to L2 (P1/L2) is less than or equal to 0.25, where P1 is a length of the joining member 11 on the first face 8 in a direction perpendicular to the first side 12.

Also in the case where the joining member 11 is spaced away from the first side 12, it is preferable that the joining member 11 is located within the range of P1 or H1 with respect to the first side 12. Needless to say, no consideration of P1 in the absence of the joining member 11 on the first face 8 and H1 in the absence of the joining member 11 on the first side face 14 is required.

In the mounting structure according to the present embodiment, the main body 1 of the laminated electronic component and the external electrode 2 are not kept in direct contact with the mounting face of the substrate 21. It is particularly preferable that the ratio of C to H0 (C/H0) is greater than or equal to 0.1, where C is the distance between the external electrode 2 and the mounting face of the substrate 21.

Moreover, although the mounting structure in the present embodiment has been illustrated as a structure in which the laminated electronic component having the joining member 11 is mounted on the substrate 21, a structure having neither the joining member 11 nor other joining member may also be regarded as the mounting structure in the present embodiment under the condition that the laminated electronic component mounted on the substrate 21 is joined, at its area where the above-described joining member 11 is to be provided, to the substrate 21. In this case, the conductor 23 such as solder for joining the laminated electronic component to the substrate 21 corresponds to the joining member 11.

The main body 1 and the external electrode 2 to which the present embodiment is applicable are similar in form and material to those in the first embodiment, and further description thereof will thus be omitted. However, for example, in a laminated electronic component of LW reverse type or multiple terminal type, the use of a joining member 11 having insulating capability is desirable. Moreover, the joining member 11 may be formed not only on the external electrode 2 but also on the main body 1, and may also be formed so as to extend over the external electrode 2 and also over the main body 1. In the case of using the joining member 11 having insulating capability, the external electrode 2 is electrically connected to an electric circuit of the substrate by wire bonding or otherwise. As an insulating material, thermoplastic resin such for example as ethylene vinyl acetate (EVA) or polypropylene (PP) is desirable for use.

Moreover, while Sn plating on the external electrode 2 is conducive to enhancement in wettability between the external electrode 2 and solder when mounting the laminated electronic component on the substrate 21, in the present embodiment, since the laminated electronic component is joined to the land patterns 22 of the substrate 21 via a pair of the joining members 11, it is possible to use an electrode free of Sn plating as the external electrode 2. Moreover, following the formation of the joining member 11, a part of the external electrode 2 which is left exposed may be treated so as to be less wettable to solder by, for example, formation of an oxide film on that exposed part.

(Third Embodiment)

In a third embodiment, like the second embodiment, there is further provided a joining member 11 located on the first face 8-side part of the external electrode 2 as provided in the foregoing first embodiment. Moreover, the first face 8, as well as the second face 9, is rectangular-shaped, is defined by the main body 1 and the external electrode 2, and has two pairs of opposed sides and vertices V. In other words, when the laminated electronic component is seen in a plan view from the first face 8 or the second face 9, the two pairs of opposed sides and the vertices V define a contour formed by the main body 1 of the laminated electronic component and the external electrode 2. In this construction, one pair of two pairs of sides defining the first face 8 is represented as a pair of first sides 12, and the other pair is represented as a pair of second sides 13. Moreover, a pair of side faces which are contiguous to the first face 8 through the corresponding first sides 12 is represented as a pair of first side faces 14, and a pair of side faces which are contiguous to the first face 8 through the corresponding second sides 13 is represented as a pair of second side faces 15. In addition, a midpoint of the first side 12 is designated by 12c, and a midpoint of the second side 13 is designated by 13c. The midpoint of the side corresponds to a bisection point in which the length of the side is bisected.

Figure 6:
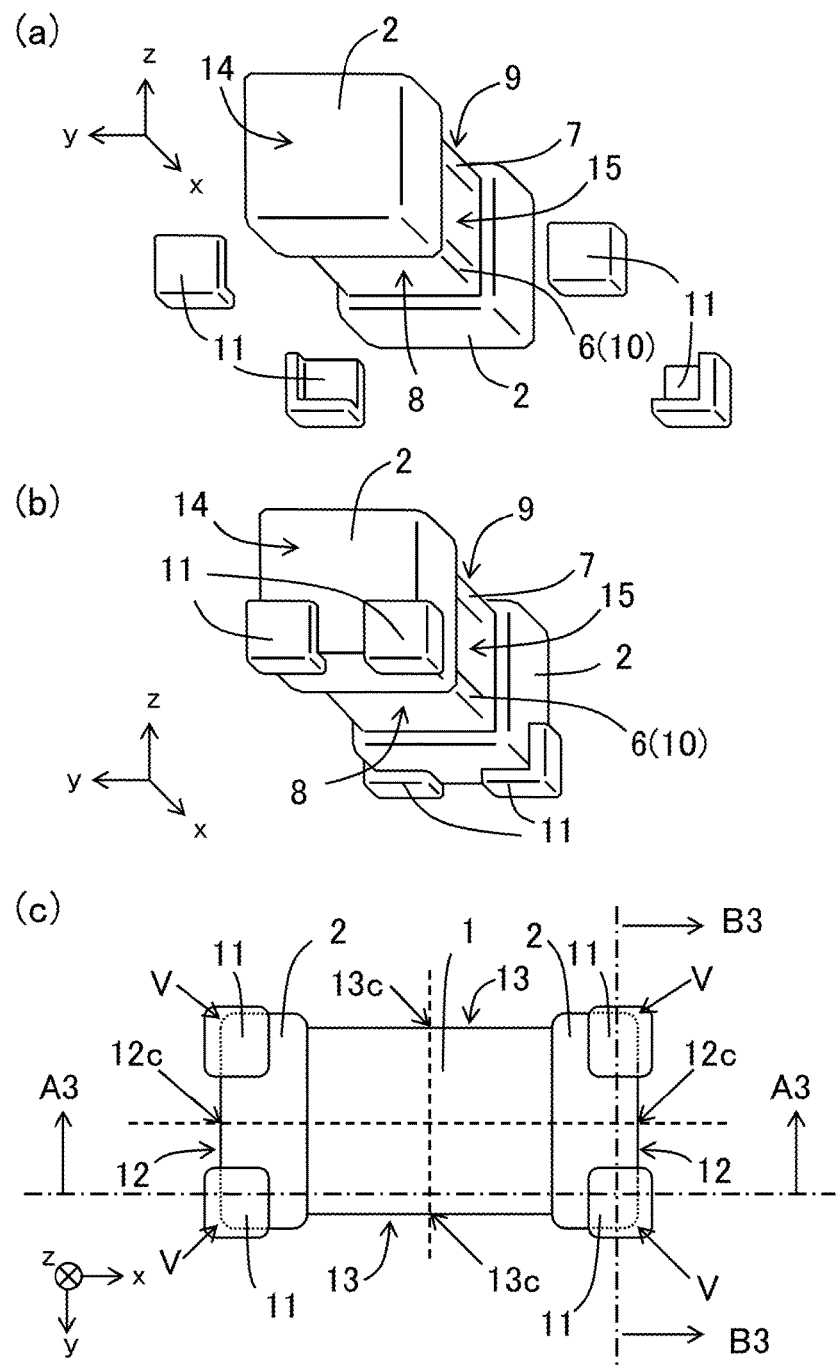
FIG. 6 is a view showing a laminated electronic component according to a third embodiment, and more specifically

In the present embodiment, as shown in FIGS. 6(a) to 6(c), the joining member 11 is formed so as to extend over the first face 8 and also over the first side face 14 and the second side face 15, while including the vertex V at the first face 8-side parts of the main body 1 and the external electrode 2, but not including lines which connect the midpoints of the opposed sides of the first face 8, the midpoints of the opposed sides of the first side face 14, and the midpoints of the opposed sides of the second side face 15, respectively. The lines connecting the midpoints of the opposed sides refer to the line connecting the opposed midpoints 12c and the line connecting the opposed midpoints 13c in the first face 8 (indicated by midpoint-connecting broken lines as shown in FIG. 6(c)), the line connecting the midpoint 12c and a midpoint of the side opposed to the first side 12 in the first side face 14 (not shown), and the line connecting the midpoint 13c and a midpoint of the side opposed to the second side 13 in the second side face 15 (not shown). In other words, in the present embodiment, four independent joining members 11 are disposed at the four corners, respectively, of the first face 8 defined by the main body 1 and the external electrode 2. Moreover, also in the present embodiment, like the first embodiment, the first cover layer 6 comprises a high-Young's modulus layer 10 which is higher in Young's modulus than the dielectric layer 3.

Thus, in the present embodiment, the joining member 11 is disposed at each corner of the region corresponding to the first face 8-side parts of the main body 1 and the external electrode 2, namely each corner of the side provided with the high-Young's modulus layer 10, so as to lie at either end of each of the paired external electrodes 2. Moreover, at least one of the joining members 11 disposed at both ends of the external electrode 2 has electrical conductivity.

As the material for the joining member 11, as in the second embodiment, use can be made of, for example, a brazing material such as eutectic solder or lead-free solder (Sn—Ag—Cu solder), and conductive adhesives.

Figure 7:
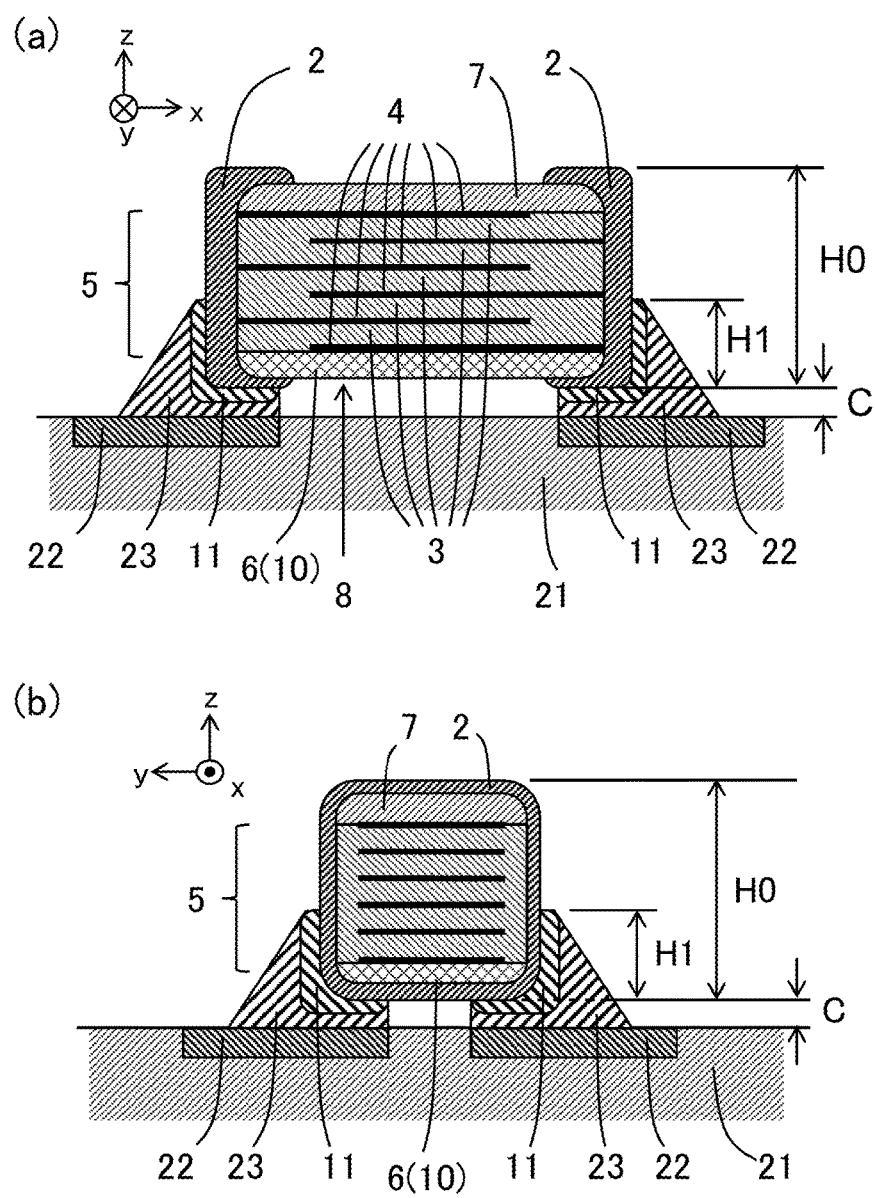
FIG. 7 is a sectional view showing a mounting structure, which is constructed by mounting the laminated electronic component according to the third embodiment on a substrate, and more specifically

The following describes a laminated electronic component mounting structure according to the present embodiment. FIG. 7(a) is a sectional view of the laminated electronic component according to the present embodiment mounted on the substrate taken along the line A3-A3 drawn in FIG. 6(c) showing the laminated electronic component, and FIG. 7(b) is a sectional view thereof taken along the line B3-B3 drawn in FIG. 6(c) showing the laminated electronic component.

In the laminated electronic component mounting structure according to the present embodiment, like the second embodiment, as shown in FIGS. 7(a) and 7(b), the external electrode 2 of the laminated electronic component and the land pattern 22 on the substrate 21 are joined to each other via the joining members 11 so that the first face 8 and the mounting face of the substrate 21 are opposed to each other. As to the joining member 11 in the present embodiment, at least one of the joining members 11 disposed at both ends of the external electrode 2 serves to join the laminated electronic component to the substrate 21, as well as to provide electrical connection between the external electrode 2 of the laminated electronic component and a circuit (not shown) of the substrate 21. In FIG. 7(b), both of the joining members 11 disposed at both ends of the external electrode 2 serve to provide electrical connection between the external electrode 2 of the laminated electronic component and the circuit (not shown) of the substrate 21.

Figure 8:
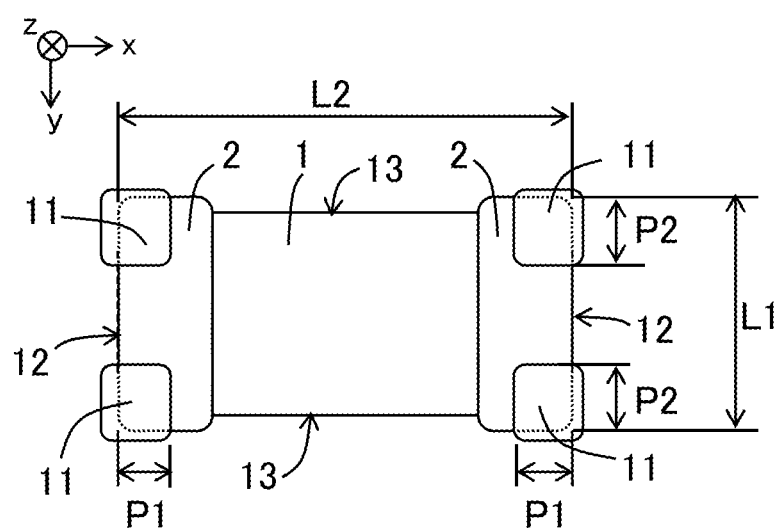
FIG. 8 is a plan view of the laminated electronic component according to the third embodiment, illustrating dimensions of each constituent thereof as seen from the first face.

As shown in FIG. 6(c), in the first face 8 defined by the main body 1 and the external electrode 2, out of two pairs of opposed sides thereof, a pair of sides of shorter length is represented as a pair of first sides 12, and a pair of sides of longer length is represented as a pair of second sides 13. Accordingly, in FIG. 8, L1 is a length of the first side 12, and L2 is a length of the second side 13. L1 and L2 represent the lengths of the laminated electronic component which comprises the main body 1 and the external electrode 2 and yet does not include the joining member 11, in other words, the lengths of the laminated electronic component exclusive of the joining member 11. In the laminated electronic component comprising the main body 1 and the external electrode 2 which have typical shapes, L1 and L2 can be considered to represent the outside dimensions of the main body 1 and the external electrode 2.

Moreover, P1 is a length of a part of the joining member 11 which extends from the first side 12 toward the center of the first face 8 in a direction perpendicular to the first side 12, and P2 is a length of a part of the joining member 11 which extends from the second side 13 toward the center of the first face 8 in a direction perpendicular to the second side 13. Moreover, as shown in FIGS. 7(a) and 7(b), H1 is the length of a part of the joining member 11 on the first side face 14 which extends from the first side 12 toward the center of the first side face 14 in the stacking direction, or the length of a part of the joining member 11 on the second side face 15 which extends from the second side 13 toward the center of the second side face in the stacking direction. C is a distance between the mounting face of the substrate 21 and the external electrode 2.

Acoustic noise simulation was made on the following model of the present embodiment. In the joining member 11, P1 was set at 160 µm, P2 was set at 155 µm, and H1 was set at 78 µm. Moreover, C in the mounting structure according to the present embodiment was set at 140 µm. Other conditions to be fulfilled by the main body 1 and the external electrode 2 are similar to those adopted in the acoustic noise simulation made on the second embodiment.

According to the result obtained by averaging the simulation data throughout a frequency range of 5 Hz to 20 kHz, a 23 dBA reduction in the mean of sound pressure level was achieved in the present embodiment as contrasted to the conventional mounting structure.

Although the ratio of P2 (155 µm) to L1 (660 µm) (P2/L1) was set at 0.235 in this simulation, it is preferable that P2/L1 falls in the range of 0.2 to 0.4 from mountability standpoint. It is preferable that each of P1, H1, and C falls in a range similar to that determined in the second embodiment.

The main body 1 and the external electrode 2 to which the present embodiment is applicable are similar in form and material to those in the first and second embodiments, and further description thereof will thus be omitted. Moreover, also in the present embodiment, an insulating material such as described previously may be used for the joining member 11. In this case, the external electrode 2 is electrically connected to an electric circuit of the substrate 21 by wire bonding or otherwise.

Moreover, the joining members 11 disposed at both ends of the external electrode 2 may be designed so that one of them has electrical conductivity, whereas the other has insulating capability.

In the descriptions of the second and third embodiments, the joining member 11 is rectangular in general form, and, the preferable ranges of dimensions and ratios as to the design of the joining member are based on this rectangular form. However, the shape of the joining member 11 is not limited to the rectangular form, but may be of another shape or an indefinite shape. Moreover, various changes and modifications are possible, on the basis of the descriptions of the vibration mode of the laminated electronic component determined in the above-described simulation and the nodal region 24, without departing from the claimed scope of the invention.

REFERENCE SIGNS LIST 1, 101: Main body
2, 102: External electrode
3, 103: Dielectric layer
4, 104: Internal electrode layer
5: Effective layer
6: First cover layer
7: Second cover layer
107: Cover layer
8: First face
9: Second face
10: High-Young's modulus layer
11: Joining member
12: First side
12c: Midpoint of the first side
13: Second side
13c: Midpoint of the second side
14: First side face
15: Second side face
21: Substrate
22: Land pattern
23, 123: Electric conductor 24: Nodal portion
31: Mounting substrate
32: Anechoic box
33: Sound-collecting microphone
34: Amplifier
35: FET analyzer
V: Vertex

The invention claimed is:

1. A laminated electronic component, comprising:
a main body comprising an effective layer in which dielectric layers and internal electrode layers are alternately laminated, and a pair of a first cover layer and a second cover layer which are disposed on opposite sides in a stacking direction of the effective layer, respectively; and
a plurality of external electrodes disposed on an outer surface of the main body,
the internal electrode layers being alternately connected to different external electrodes, and
the first cover layer comprising a high-Young's modulus layer which is higher in Young's modulus than the dielectric layers,
the second cover layer having a Young's modulus which is less than a Young's modulus of the dielectric layer,
the Young's moduli of the dielectric layer, the high-Young's modulus layer and the second cover layer being determined by using a nanoindentation method.

2. The laminated electronic component according to claim 1,
wherein the dielectric layers and the first and second cover layers are made of ceramics, and
the main body is an integrated combination of the dielectric layers, the internal electrode layers, and the pair of first and second cover layers.

3. The laminated electronic component according to claim 2, the laminated electronic component being a laminated ceramic capacitor.

4. The laminated electronic component according to claim 1,
wherein a ratio [T1/T0] of T1 to T0 is greater than or equal to 0.1, where T0 is a thickness of the main body in the stacking direction and T1 is a thickness of the high-Young's modulus layer in the stacking direction.

5. The laminated electronic component according to claim 1,
wherein a ratio [E1/E0] of E1 to E0 is greater than or equal to 1.4, where E0 is a Young's modulus of the dielectric layer and E1 is a Young's modulus of the high-Young's modulus layer.

6. The laminated electronic component according to claim 1,
wherein the laminated electronic component is formed into a rectangular prism having a pair of faces opposed to each other in the stacking direction, and four side faces, the pair of faces are composed of a first face located on a first cover layer side and a second face located on a second cover layer side, and the four side faces are located between the first face and the second face, and
at least one of a part of the main body located on the first face side and a part of the external electrode located on the first face side is provided with a joining member.

7. The laminated electronic component according to claim 6,
wherein the first face is rectangular-shaped, and
when one pair of two pairs of opposed sides of the first face is a pair of first sides, and the other pair is a pair of second sides, and a pair of the side faces which are contiguous to the first face through the corresponding first sides is a pair of first side faces,
at least one of the first side, a region in the first face which is close to the first side, and a region in the first side face which is close to the first side is provided with the joining member.

8. The laminated electronic component according to claim 7, wherein L1<L2, where L1 is a length of the first side and L2 is a length of the second side.

9. The laminated electronic component according to claim 6,
wherein the first face and the second face are each a rectangle having four vertices and two pairs of sides,
at least one of each of the four vertices of the first face, each of four regions of the first face which are close to the four vertices, and each region close to corresponding one of the four vertices in a range of the four side faces is provided with the joining member, and
the joining member is not disposed on lines connecting midpoints of the opposed sides of the first face and lines connecting midpoints of the opposed sides of the side face.

10. A laminated electronic component mounting structure, comprising:
a substrate having a mounting face; and
the laminated electronic component according to claim 6, the laminated electronic component being joined to the mounting face of the substrate via the joining member, the first face of the laminated electronic component being opposed to the mounting face.

11. A laminated electronic component mounting structure, comprising:
a substrate having a mounting face; and
the laminated electronic component according to claim 1, the laminated electronic component being joined to the mounting face of the substrate, the first cover layer of the laminated electronic component being opposed to the mounting face.

12. A laminated electronic component, comprising:
a main body comprising an effective layer in which dielectric layers and internal electrode layers are alternately laminated, and a pair of a first cover layer and a second cover layer which are disposed on opposite sides in a stacking direction of the effective layer, respectively; and
a plurality of external electrodes disposed on an outer surface of the main body,
the internal electrode layers being alternately connected to different external electrodes, and
the first cover layer comprising a high-Young's modulus layer which is higher in Young's modulus than the dielectric layers,
wherein a ratio [T1/T0] of T1 to T0 is greater than or equal to 0.1, where T0 is a thickness of the main body in the stacking direction and T1 is a thickness of the high-Young's modulus layer in the stacking direction,
a ratio [E1/E0] of E1 to E0 is greater than or equal to 1.4, where E0 is a Young's modulus of the dielectric layer and E1 is a Young's modulus of the high-Young's modulus layer, and
the laminated electronic component includes a first face located on a first cover layer side and a second face located on a second cover layer side and two pairs of opposing side faces, at least one of a part of the main body located on the first face side and a part of the external electrode located on the first face side is provided with a joining member which is not disposed on lines connecting midpoints of the opposing sides of the first face and the side faces.

* * * * *